Figure 1A:
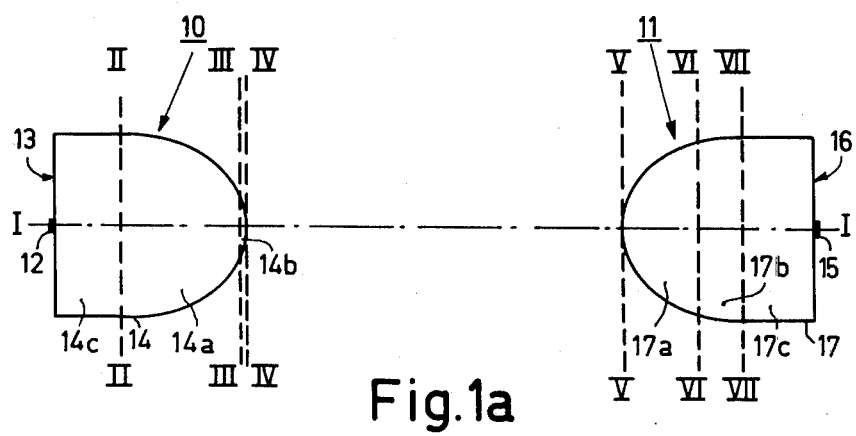

United States Patent [19]

Guilleman et al.

[11] 4,118,633
[45] Oct. 3, 1978

[54] OPTO-ELECTRONIC DEVICE HAVING COUPLED EMITTER AND RECEIVER

[75] Inventors: Lionel Guilleman, Massy; Jacques Claude Thillays, Herouville St Clair, both of France

[73] Assignee: U.S. Philips Corporation, New York, N.Y.

[21] Appl. No.: 618,213

[22] Filed: Sep. 30, 1975

[30] Foreign Application Priority Data

Oct. 1, 1974 [FR] France .................. 74 33049

[51] Int. Cl.² .................................. G02B 27/00
[52] U.S. Cl. ........................ 250/551; 357/19
[58] Field of Search ............ 250/551, 552, 239; 307/311; 350/96 C; 357/19

[56] References Cited

U.S. PATENT DOCUMENTS

| 3,562,527 | 2/1971 | Chaimowicz | 250/551 |
| 3,845,318 | 10/1974 | Thillays | 357/19 |
| 3,891,858 | 6/1975 | Schoberl | 250/239 |

Primary Examiner—David C. Nelms
Attorney, Agent, or Firm—Frank R. Trifari; Simon L. Cohen

[57] ABSTRACT

An opto-electronic coupler uses a light emitter and a photo-sensitive receiver, which are each associated with transparent bodies of revolution having convex and cylindrical portions.

8 Claims, 4 Drawing Figures

OPTO-ELECTRONIC DEVICE HAVING COUPLED EMITTER AND RECEIVER

The invention relates to an opto-electronic device comprising a light emitter and a photosensitive receiver each consisting of an optically and electrically active element, in which the emitter and the receiver are each provided in an accurately determined place of the base plane of an optical body of revolution having a convex structure which is manufactured from at least one material which is transparent to the beam of light rays which actuates the said device, the convex portion of the two optical elements facing each other.

The electric quality of such a device which belongs to the group of so-called photocouplers is estimated especially for the value of the current transmission ratio, that is for the value of the ratio between the output current of the photosensitive receiver and the input current of the light emitter.

Physically, the energy transfer between the two parts of the photocoupler involves a number of different stages during which a part of the energy is lost. The losses are to be distinguished as conversion losses (conversion of the current into light energy by the emitter and, conversely, by the receiver), as losses by absorption in the various media traversed by the light, and as transfer losses of the light energy (losses due to the fact that the light rays originating from the active element of the emitter are not all converged on the active element of the receiver). Of these various losses, the transfer losses are no doubt highest.

This is noticeable in particular in photocouplers of small dimensions — which are used at present, for example, for reading punched cards, which comprise on the emitter side a minuscule semiconductor crystal (photoemission diode) which is uncovered or embedded in an optical device of semi-spherical cross-section which is arranged opposite to another small semiconductor crystal arranged on the receiver side, for example a phototransistor (which is uncovered or is also incorporated in a semi-spherical optical device). The current transfer ratio with such devices reaches at most 10%, with an optimum geometric arrangement of the emitter relative to the receiver. An extremely small displacement of one of the two crystals relative to the common axis according to which the two said crystals are preferably arranged or a slightly inclined position (two to three degrees) of the active surface of the emitter crystal or of the receiver crystal causes the transfer ratio to decrease already from 8 to 2%.

So it is easy to recognize that it is difficult to achieve with such devices which are built up from minuscule semiconductor crystals that the emitter and the receiver are arranged perfectly correctly relative to each other. In fact, tolerances have to be permitted both as regards the dimensions and the regular shape of the crystals and their optical elements, and as regards the positions of the said crystals within the said optical elements, even when all manufacturing processes are carried out in series production. On the other hand, the arrangement of the emitter and receiver in the photocoupler cannot be carried out with absolute accuracy. It is therefore understood that the transfer ratios which are already small are also still variable between similar, in principle identical, devices.

It is an object of the invention to provide a photocoupler having significantly improved current transmission ratios as compared with the transmission ratios which are obtained with the prior art device. Another object of the invention is to reduce the excessive non-uniformities of the values of the current transmission ratio between fundamentally similar photocouplers. The invention uses in particular the specific known properties which are related to certain optical profiles.

In order to achieve this object, the opto-electronic device mentioned in the preamble is characterized in that the emitter side of the optical element viewed from the top thereof and in the direction of the base plane, comprises a portion in the form of a spherical cap which is centered on the emitter crystal, then a portion having focusing properties relative to the optical element of the receiver side, and then a cylindrical portion, while the optical element on the side of the receiver, viewed from the top thereof and in the direction of the base plane, comprises a portion having focusing properties relative to the active receiver element, then an exponentially varying portion and finally a cylindrical portion.

In this optical system which has been suggested and elaborated by applicants, the portion in the form of a spherical cap on the emitter side corresponds to the portion having focusing properties on the receiver side; each light ray which originates from the emitter crystal and which traverses the said portion in the form of a spherical cap is thus reflected by the said portion having focusing properties on the receiver crystal.

However, the optical receiver element has restricted dimensions, in addition it is remote from the optical emitter element. It is thus inevitable, from a certain limit angle of the rays emitted by the emitter crystal relative to the axis of the device, to vary the curvature of the optical emitter element in such manner that the light rays are converged slightly towards the receiver; hence the presence of a portion having focusing properties on the optical emitter element and immediately after the portion in the form of a spherical cap.

According to a further aspect of the invention, the portion having focusing properties of the optical emitter element is profiled so as to guide the beam of light rays towards the edge of the portion having focusing properties of the optical receiver element, or at least partly over the exponentially varying portion of the said optical receiver element.

An object of such a device is to achieve that the said beam "is incident in a skimming manner" on the optical receiver element so as to minimize the transfer losses as a result of geometrical inperfections of the system. In fact, experience proves that, when an exponentially varying portion is used, the effect of errors related to the optical emitter crystal has a less disadvantageous influence on the receiver crystal according as the rays reach the optical receiver element at substantially "skimming" angles.

The optical emitter and receiver elements each comprise a cylindrical portion the function of which is restricted to the transfer of light rays from the crystal or to the crystal present at their base. The height of the cylindrical portion depends of course at any rate on the profile of the other portions of the optical element with which it is associated, which profiled determine the position of the said crystal. At any rate, said height on the side of the emitter should at most be equal to $R/\sqrt{n^2 - 1}$, where R is the base radius of the portion and n is the index of refraction of the composing material, so as to avoid the light rays from traversing laterally through the said portion.

The formation of the profiles of the portions having focusing properties of each of the optical elements is the most delicate part of the manufacture. In fact, the calculation should not only observe the physical data, for example the indices of refraction of the media in question, or the geometric data, such as the distance which separates the faces of the emitter receiver crystals or the radii of the base portions of the optical elements. The maximum possible defects as regards the arrangement of the crystals in the optical elements or the arrangement of the optical receiver element relative to the optical emitter element, or variations occuring in the distance between the two optical elements should also be taken into account.

Experiments performed by applications for various photocouplers the optical elements of which are formed according to the characteristic features of the invention have resulted in obtaining current transfer ratios which lie between 30 and 55%. These figures are very significantly higher than those obtained with devices of a known nature and the principal advantage of the devices according to the invention resides herein.

Another important advantage of the device according to the invention is a larger tolerance as regards assembly irregularities. Displacements of, for example, up to 1/10 mm of the emitter crystal or receiver crystal on either side of the axis of their respective optical element or an error in arrangement angle up to approximately 3° of the active plane of the crystal on the said axis do not involve any reduction of the current transfer ratio. The manufacture of the assembly has thus been considerably simplified.

The current transfer ratio achieves at least 50% when the base radius of the optical emitter element is at most equal to that of the optical receiving element. This value of 50% is maintained for distances between the tops of the two optical elements which lie between 10 and 20 mm, which corresponds entirely to the normal conditions for use of the photocoupler of a modern conception.

When the base radius of the optical receiver element is smaller than that of the optical emitter element, the device proves to be very sensitive to variations of various geometric parameters, for example, to the distance between the tops of the two optical elements. A marked sensitivity peak is observed for a correct mutual distance.

In a special embodiment of the invention the optical emitter and receiver elements have the same dimensions and the same profiles. This has the important advantage of facilitating the manufacture. However, the current transfer ratio is less high and lies near 40%. It should be mentioned that this figure is still significantly higher than that measured in known photocouplers.

In a photocoupler according to the invention equipped with identical optical emitter and receiver elements, the said optical elements preferably comprise, from their top to their base, first of all a front portion having a small aperture in the form of a spherical cap, then a focusing portion and finally a cylindrical portion.

The optical elements of the photocouplers according to the invention may be manufactured either of one single material or by means of various materials.

In the former case, the use of one material moulds having concave imprints of the optical elements are manufactured in known manner and each cavity is filled with a transparent expoxy resin in which the crystal previously welded to a support is arranged in a suitable place.

The optical elements according to the invention are preferably manufactured partly in the form of capsules which are molded of a plastic material of a polycarbonate type. The crystals which are connected to a support are provided in their place in their capsule and the space which remains free between the capsule and the crystal is filled with a resin having suitable optical properties.

It is of importance to provide in the capsules "positioning dams" which facilitate the arrangement of the crystals and their supports according to a technique which is described for this purpose by applicants in French Pat. No. 2,165,161.

Figure 1B:
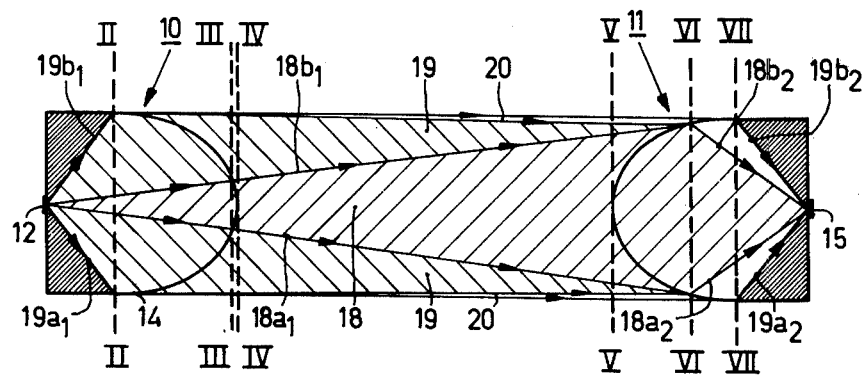
Figure 2:
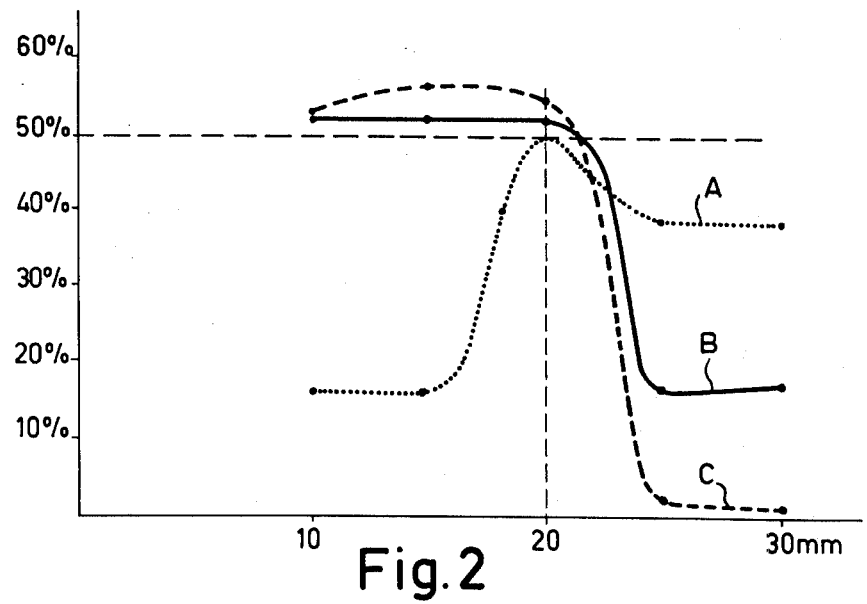
Figure 3:
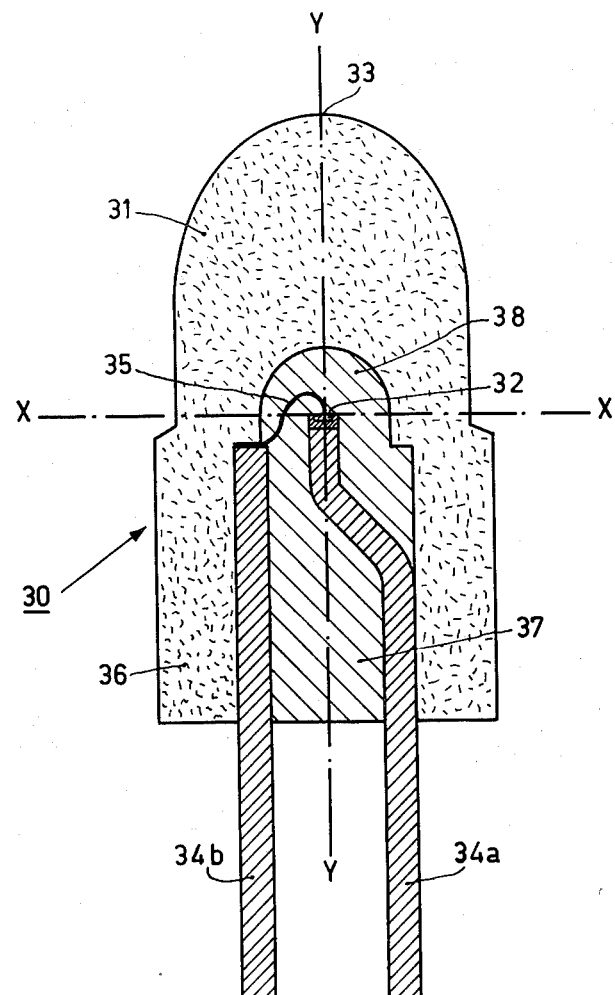

The invention will now be described in greater detail with reference to the accompanying drawing, in which FIG. 1a is a diagrammatic axial longitudinal cross-sectional view of a couple of optical elements which may be used in a photocoupler according to the invention and FIG. 1b shows the distribution of the active light rays, FIG. 2 is a graph showing the value of the current transfer ratio as a function of the distance between the two optical elements, for three photocouplers having similar profiled optical elements according to the invention and the base radius of which on the side of the emitter is the same, while the base radii on the side of the receiver are different, FIG. 3 is an axial longitudinal sectional view of the emitter or the receiver of a photocoupler according to the invention which uses an optical element having a profiled outer capsule.

The device shown in FIG. 1a comprises a light emitter 10 and a photosensitive receiver 11 which are arranged at some distance opposite to each other. The light emitter 10 comprises an active element, for example, a light-emissive semiconductor diode 12, the active surface of which is co-planar with the base plane 13 of an optical element 14. A photosensitive receiver 11 also comprises an active element, for example a phototransistor 15, the active surface of which is coplanar with the base plane 16 of an optical element 17. The two optical elements 14 and 17 are rotationally symmetric relative to an axis I—I on which axis the elements 12 and 15 are also present.

According to the invention, each of the two optical elements 14 and 17 comprises a portion having focusing properties. In the embodiment of the photocoupler shown in FIG. 1, the portion having focusing properties is present on the emitter side at 14a between the planes II and III at right angles to the plane of the drawing, and on the side of the receiver in the front portion 17a of the optical element 17 between the planes V and VI, the plane V touching the said portion 17a.

In addition to the portion having focusing properties, the optical emitter element 14 preferably comprises two other portions, on the one hand a front portion 14b which is present between the planes III and IV and is in the form of a spherical cap the center of curvature of which is located in the active plane of the diode 12, and on the other hand a cylindrical portion which is placed between the base plane 13 and the plane II. The optical receiver element also comprises three portions: the above-mentioned portion having focusing properties 17a succeeded by an exponentially varying portion 17b which is present between the planes VI and VII, and a cylindrical portion extending between the plane VII and the base plane 16 of the said optical element. The two optical elements are designed so that the profiles of their various portions merge into each other in a flowing manner so as to minimize the transfer losses.

The distribution diagram of the active light rays between the light emissive diode 12 and the phototransistor 15 which are arranged at the two extremities of the system shown in FIGS. 1a and 1b shows three different beams (see FIG. 1b), A first beam 18 of which the center angle on the emitter side corresponds to the dimensions of the portion 14b in the form of the spherical cap and which on the plane of FIG. 1b is bounded by the marginal beams 18$a_1$ and 18$b_1$, covers on the receiver side the outer surface of the portion 17a having focusing properties; said beam is deflected by the said portion 17a of the optical element 17 and is focussed in the direction of the phototransistor 15, the marginal beams 18$a_2$ and 18$b_2$ on the plane of the FIG. representing the boundaries of the refracted beam.

A second beam 19 which on the emitter side corresponds to the portion having focusing properties 14a and which in this portion and the plane of the drawing on the one hand is bounded by the rays 18$a_1$ and 19$a_1$ and on the other hand by the rays 18$b_1$ and 19$b_1$, converges, upon leaving the said portion 14a, towards the edge of the portion 17a of the optical element 17. Strictly speaking, the beam 19 on the optical element 17 intersects according to the circular line of intersection of the said optical element 17 through the plane which corresponds to the broken line VI. It will be obvious that in practice and taking into account the inevitable aberrations and irregularities of the optical arrangement of the system, beam 19 impinges upon the optical element 17 according to a narrow ring the surface of which forms part both of the portion 17a and of the subsequent portion 17b. The rays of the beam 19, from their contact on the optical element 17, are refracted towards the phototransistor 15 according to a path which, in the plane of FIG. 1b, corresponds on an average to the above-mentioned rays 18$a_2$ and 18$b_2$.

A third beam 20 which on the emitter side corresponds to marginal rays which adjoin the rays 19$a_1$ and 19$b_1$, leaves the optical element 14 according to a direction which is substantially parallel to the axis I—I. Said beam reaches the optical element 17 according to large angle of incidence which is substantially "skimming" and, on the said optical element 17, covers the surface of the exponentially varying portion 17b (an exponential cross-section means that every incident ray which touches the surface of the portion encloses a constant angle with the corresponding vector ray which is guided from the receiving crystal towards the tangent point).

The corresponding refracted beam in the optical element 17 which is shown on the plane of FIG. 1b between the rays 18$a_2$ and 19$a_2$ on the one hand and 18$b_2$ and 19$b_2$ on the other hand, converges towards the phototransistor 15.

With a system of the above-described type, the inevitable imperfectnesses, for example, minimum decentering of the elements 12 and 15 on the axis I-I or an error of displacement of the optical element 17 relative to the optical element 14, or a comparatively important variation of the distance between the tops of said optical elements, do not result in large transfer losses, which is the case indeed in known photocouplers.

A system of this type should be based on the recognition of the fact that an error of angle of a ray originating from the emitter crystal and incident on the interface between the optical emitter element and the outer medium which is common for both optical elements, may cause only a minimum error on the corresponding refracted ray. In the same manner, an error of angle on a ray which impinges on the surface of the optical receiver element may involve only a minimum error of angle on the refracted ray in said optical element. Consequently, the study of the suitable profiles is based on that of the ratio $d\theta_r/d\theta$ of the errors of angle at the interface of the two media having different indices of refraction.

In the case of the emitter, the results of said study prove that $d\theta_r/d\theta$ is minimum at a normal incidence on the surface of the optical element, when $\theta_i$ is the angle of incidence of the ray originating from the emitter crystal and $\theta_r$ is the angle of refraction corresponding to the ray which penetrates in the outer medium, in this case the air.

In the case of receiver, when $\theta_i$ is the angle of incidence originating from the optical emitter element and $\theta_r$ is the angle of refraction of the ray which penetrates into the optical receiver element, $d\theta_r/d\theta_i$ is minimum with a "skimming" incidence on the surface of the optical receiver element.

Consequently it is of importance on the one hand on the emitter side, to give the optical element a spherical shape centered on the emitter crystal (the rays are then incident on the surface of said portion at a normal angle of incidence) and, on the other hand on the receiver side, to concentrate the luminous power which is emitted by the emitter on the side of the receiver (so that the rays are received as much as possible under a "skimming" incidence).

Starting from these considerations, applicants have been able to suggest and construct coherent optical systems which are analogous or identical to those described above. In these systems, the size of the portion in the form of a spherical cap of the optical emitter element of course depends on the dimensions of the optical receiver element and on the distance between the two optical elements. With a comparatively large distance between the emitter and the receiver, compared with the dimensions of the optical elements, the portion in the form of a spherical cap is strongly reduced and may then be integrated and incorporated in the portion having focusing properties.

In the optical elements 14 and 17 of a system shown in FIG. 1, the cylindrical portions 14c on the emitter side and 17c on the receiver side transmit the light rays but do not vary the paths of said rays. The respective heights of said portions depend in each optical element on the geometric characteristics of the other portions; especially on the emitter side the height of the portions 14c is essentially related to the radius of curvature of the portion 14b in the form of a spherical cap, for the diode 12 is arranged in the centre of curvature of the said portion 14b. However, in order to restrict the losses by lateral light transmission on the emitter side (that is by transmission beyond the cone bounded by the rays 19$a_1$ and 19$b_1$), it has been established that the height of the portion 14c (distance between the base plane 13 and the plane which corresponds to the vertical broken line II) may in no case exceed the value of the ratio $R/n^2-1$, where R is the radius of the plane of the optical element which is present in the base plane 13 and $n$ is the index of refraction of the material which forms said optical element.

Advantageously in boundary cases, it is of importance to cover the lateral surface of the portion 14c with a film of a material having reflecting properties.

FIG. 2 shows three curves which, in concrete cases of optical systems shown in FIG. 1, which have been realized by applicants, represent the variations in percent of the current transfer ratio as a function of the distance in mm between the tops of the said two optical elements. In this case they are devices which on the one hand on the emitter side comprise a photoemissive diode which consists of a semiconductor crystal having an effective surface area of $4.10^{-2}$ sq.mm, coupled to an optical element, the base radius of which is 2 mm, and on the other side, on the receiver side, comprise a phototransistor formed in a semiconductor crystal which has an effective area which is equal to 0.1 sq.mm coupled to an optical element the base radius of which is 1.5 mm (curve A), 2 mm (curve B), 2.5 mm (curve C).

The graph shows that the current transfer ratio significantly exceeds 50% in the two cases of curves B and C at distances between the two optical elements which may vary between 10 and 20 mm. Especially striking is a remarkably constant result at 53% when the optical emitter and receiver elements have the same base radius. In the case of curve A, that is when the radius of the optical emitter element is larger than that of the optical receiver element, the current tranfer ratio is very sensitive to small variations of the distance between the two optical elements and in addition said transfer ratio does not exceed 50%.

Hence it is preferably of importance for the radius of the optical emitter element to be lower than or rather equal to that of the optical receiver element.

The optical elements of the photocouplers according to the invention are preferably manufactured in the form of moulded capsules as is shown in FIG. 3. In this Fig. the part of the capsule 30 of which the outer surface is profiled according to the invention is the upper portion 31 which is arranged above the horizontal plane which corresponds to the axis XX. The optical element is a body of revolution about the axis YY.

The semiconductor crystal 32 is placed near the crossing of the axes XX and YY; its active face, which faces the top 33 of the optical element, is coplanar with the horizontal plane defined by the axis XX. In known manner said crystal is connected electrically, and, according to the method described above by applicants in the above mentioned Patent Specification Nr. 2,165,151, is connected on the one hand to the conductor 34a on which it bears and on the other hand to the lateral conductor 34b by the connection wire 35. In this case it is a light-emissive diode; in the case of a phototransistor a third conductor would have to be provided which may be arranged laterally, as the conductor 34b, and be shifted angularly relative to the latter.

The portion 31 of the capsule 30 continuous below the axis XX by a jacket 36 in the form of a cylindrical ring in which the conductors 34a and 34b are accommodated.

The inner volume 37 of the capsule 30, after arranging the crystal, is filled in known manner with a transparent hardening material having suitable optical properties. A space 38 is provided in the upper portion 31 of the capsule 30 within the limits of the volume 37 above and around the axial place in which the crystal 32 is present. This space is provided so as to facilitate the accurate arrangement of the crystal 32 and also to accommodate the connection wires such as 35 in it.

The space 38 preferably has a semi-spherical shape which is centred on the crystal 32. Such a shape is chosen because it permits, in any point of the surface thereof, the passage of all light rays originating from the crystal 32 in the capsule 30 whatever the value of the index of refraction of the intermediate medium which fills the space 38 may be.

The capsule 30 has been manufactured by moulding, for example, of a plastic material of a polycarbonate type the index of refraction of which is between 1.58 and 1.59. The volume 37 is filled with a thermohardening resin, for example a resin known as "ARALDITE D" of CIBA; the index of refraction of this resin is substantially equal to 1.58, that is to say a value which is very near, if not accurately equal to, the index of the material of the capsule. The presence of the two transparent media having proximate but different indices of refraction in the portion 31 of the optical element 30 which is traversed by the light rays should be taken into account in determining the profiles of said optical element. However, in order to facilitate said determination, it is ensured that the volume of the space 38 is inscribed entirely in the cylindrical portion of the optical element.

The table below shows by way of example the dimensions of an optical body of revolution having a profile according to the invention which may be used on the emitter side and the receiver side in a photocoupler. The overall height of the optical element (distance between the top 33 and the axis XX) is 2.55mm, the base diameter thereof is 2.50mm.

In the table, the distances, in mm, give the diameter X of the optical element with various calculated heights on the axis YY from the centre of the crystal 32.

| x | y |
|---|---|
| 0.00 | 2.55 |
| 0.30 | 2.54 |
| 0.48 | 2.52 |
| 0.64 | 2.50 |
| 0.86 | 2.45 |
| 1.06 | 2.40 |
| 1.20 | 2.35 |
| 1.32 | 2.30 |
| 1.54 | 2.20 |
| 1.72 | 2.10 |
| 1.86 | 2.00 |
| 2.00 | 1.90 |
| 2.22 | 1.65 |
| 2.38 | 1.40 |
| 2.46 | 1.15 |
| 2.50 | 0.90 |
| 2.50 | 0.70 |
| 2.50 | 0.50 |
| — | — |
| 2.50 | 0 |

Such an optical element comprises three portions: a front portion having a small aperture in the form of a spherical cap having a radius of curvature equal to 2.55 mm, further a focusing portion and finally a cylindrical portion. It is ensured that the distance between the optical emitter element and the optical receiver element is from 10 to 20 mm (distance measured between the tops); considering said comparatively large distance between the two optical elements) compared with their own dimensions, the aperture of the portion in the form of a spherical cap is small and hence said portion is substantially incorporated in the focussing portion. The height of the cylindrical portion is 0.90 mm.

In a photocoupler the emitter and receiver of which are equipped with a profiled optical element according to the data of the above table, in which the optical element is manufactured from a material having an index of refraction between 1.58 and 1.59, the current transfer ratio is between 35 and 40%.

What is claimed is:

1. An opto-electric device comprising light emitter means for converting electrical circuit into light; light receiving means for converting light from the light emitter means into electrical current; a transparent emitter optical body of revolution having a convex structure and being provided with an emitter base plane proximate said light emitter means; a transparent receiver optical body having a generally convex structure and being provided with a receiver base plane; said emitter optical body comprising a cylindrical portion on said emitter base plane, a portion having focussing properties with respect to said receiver optical body on said cylindrical portion, and a spherical cap on said portion having said focussing properties and centered on said light emitter means; said receiver optical body comprising a cylindrical portion on said receiver base plane, an exponentially varying portion on said cylindrical portion and a portion having focussing properties relative to the light receiving means on said exponentially varying portion.

2. A device as claimed in claim 1, wherein the height of the emitter optical body, measured between the emitter base plane and the portion of the emitter optical body closest to the receiver optical body, is equal to the radius of the spherical cap.

3. A device as claimed in claim 1, wherein the height of the cylindrical portion of the emitter optical body is equal to the quotient $R/\sqrt{n^2-1}$, where R is the radius of the cylindrical portion of the emitter optical body and the radius of the emitter base plane, and $n$ is the index of refraction of the transparent material of which the optical element is manufactured.

4. A device as claimed in claim 1, wherein the portion having focusing properties of the emitter optical body is profiled so as to guide the beam of light rays originating from the light emitter means towards an edge of the portion having focusing properties of the receiver optical body present on the base side.

5. A device as claimed in claim 1, wherein the emitter optical body and the receiver optical body have base planes of equal diameter.

6. A device as claimed in claim 1, wherein the diameter of the emitter base plane is smaller than that of the receiver optical body.

7. A device as claimed in claim 1, wherein the optical receiver and emitter bodies each consist of a profiled capsule of a first transparent material and a second transparent material.

8. An opto-electric device comprising light emitter means for converting electrical current into light; light receiver means for converting light from the light emitter means into electrical current; a transparent emitter optical body of revolution having a convex structure and being provided with an emitter base plane proximate said light emitter means; a transparent receiver optical body having a generally convex structure and being provided with a receiver base plane; said emitter optical body comprising a cylindrical portion on said emitter base plane, a portion having focussing properties with respect to said receiver optical body on said cylindrical portion, and a spherical cap on said portion having focussing properties and centered on said light emitter means; said receiver optical body comprising a cylindrical portion on said receiver base plane, a portion having focussing properties with respect to said light receiving means and a spherical cap on said portion having focussing properties and centered on said light receiving means.

* * * * *